United States Patent [19]

Hayashi et al.

[11] Patent Number: 5,764,093
[45] Date of Patent: Jun. 9, 1998

[54] VARIABLE DELAY CIRCUIT

[75] Inventors: Yokichi Hayashi, Ohra-gun; Hiroshi Tsukahara; Katsumi Ochiai, both of Gyoda; Masuhiro Yamada, Ashikaga; Naoyoshi Watanabe, Gyoda, all of Japan

[73] Assignee: Advantest Corporation, Tokyo, Japan

[21] Appl. No.: 850,816

[22] Filed: May 2, 1997

Related U.S. Application Data

[60] Continuation of Ser. No. 527,128, Sep. 12, 1995, abandoned, which is a division of Ser. No. 394,249, Feb. 24, 1995, Pat. No. 5,495,197, which is a division of Ser. No. 253,216, Jun. 2, 1994, Pat. No. 5,440,260, which is a division of Ser. No. 924,520, Aug. 4, 1992, abandoned.

[30] Foreign Application Priority Data

| Nov. 28, 1981 | [JP] | Japan | 3-98755 |
| Aug. 14, 1991 | [JP] | Japan | 3-204365 |
| Nov. 8, 1991 | [JP] | Japan | 3-293230 |
| Nov. 8, 1991 | [JP] | Japan | 3-293231 |
| Nov. 8, 1991 | [JP] | Japan | 3-293232 |
| Nov. 8, 1991 | [JP] | Japan | 3-293233 |

[51] Int. Cl.$^6$ .............................. H03H 11/26
[52] U.S. Cl. .......................... 327/276; 327/278
[58] Field of Search ..................... 327/264, 271, 327/272, 276, 277, 278; 326/82

[56] References Cited

U.S. PATENT DOCUMENTS

| 4,694,208 | 9/1987 | Szabo et al. | 327/261 |
| 4,701,714 | 10/1987 | Agoston | 327/277 |
| 4,821,003 | 4/1989 | Kameya | 327/277 |
| 4,894,791 | 1/1990 | Jiang et al. | 327/276 |
| 5,012,142 | 4/1991 | Sonntag | 307/605 X |
| 5,051,630 | 9/1991 | Kogan et al. | 327/264 |
| 5,055,706 | 10/1991 | Nakai et al. | 307/603 X |
| 5,121,014 | 6/1992 | Huang | 307/605 |
| 5,130,564 | 7/1992 | Sin | 327/264 |
| 5,134,311 | 7/1992 | Biber et al. | 326/82 |
| 5,164,621 | 11/1992 | Miyamoto | 307/603 X |
| 5,185,540 | 2/1993 | Boudry et al. | 327/276 |
| 5,229,667 | 7/1993 | Shimizu | 327/277 |
| 5,283,631 | 2/1994 | Koerner et al. | 327/393 |
| 5,294,848 | 3/1994 | Kannegundla | 327/261 |
| 5,352,945 | 10/1994 | Casper et al. | 327/261 |

OTHER PUBLICATIONS

Wakerly, Digital Design Principles & Practices 1990 Prentice–Hall, Inc., Englewood Cliffs.

*Primary Examiner*—Timothy P. Callahan
*Assistant Examiner*—Jeffrey Zweizig
*Attorney, Agent, or Firm*—Staas & Halsey

[57] ABSTRACT

A fine variable delay circuit includes a buffer having an input connected to a signal input terminal and an output. The buffer has an output impedance and outputs a logical level from the output. The fine variable delay circuit also includes a schmidt trigger buffer having an input connected to the output of the buffer and an output connected to a signal output terminal, a CMOS transistor having a gate and two electrodes, the gate being connected to a connection point between said buffer and said schmidt trigger buffer. In addition, the fine variable delay circuit includes a first switching element connected between one of the electrodes of the CMOS transistor and one terminal of a power supply, a second switching element connected between another of the electrodes of the CMOS transistor and another terminal of the power supply, and a delay setting circuit responsive to a select signal for controlling the first switching element and the second switching element to set simultaneously each of the first switching element and the second switching element to one of an ON and an OFF state, thereby setting a delay.

7 Claims, 3 Drawing Sheets

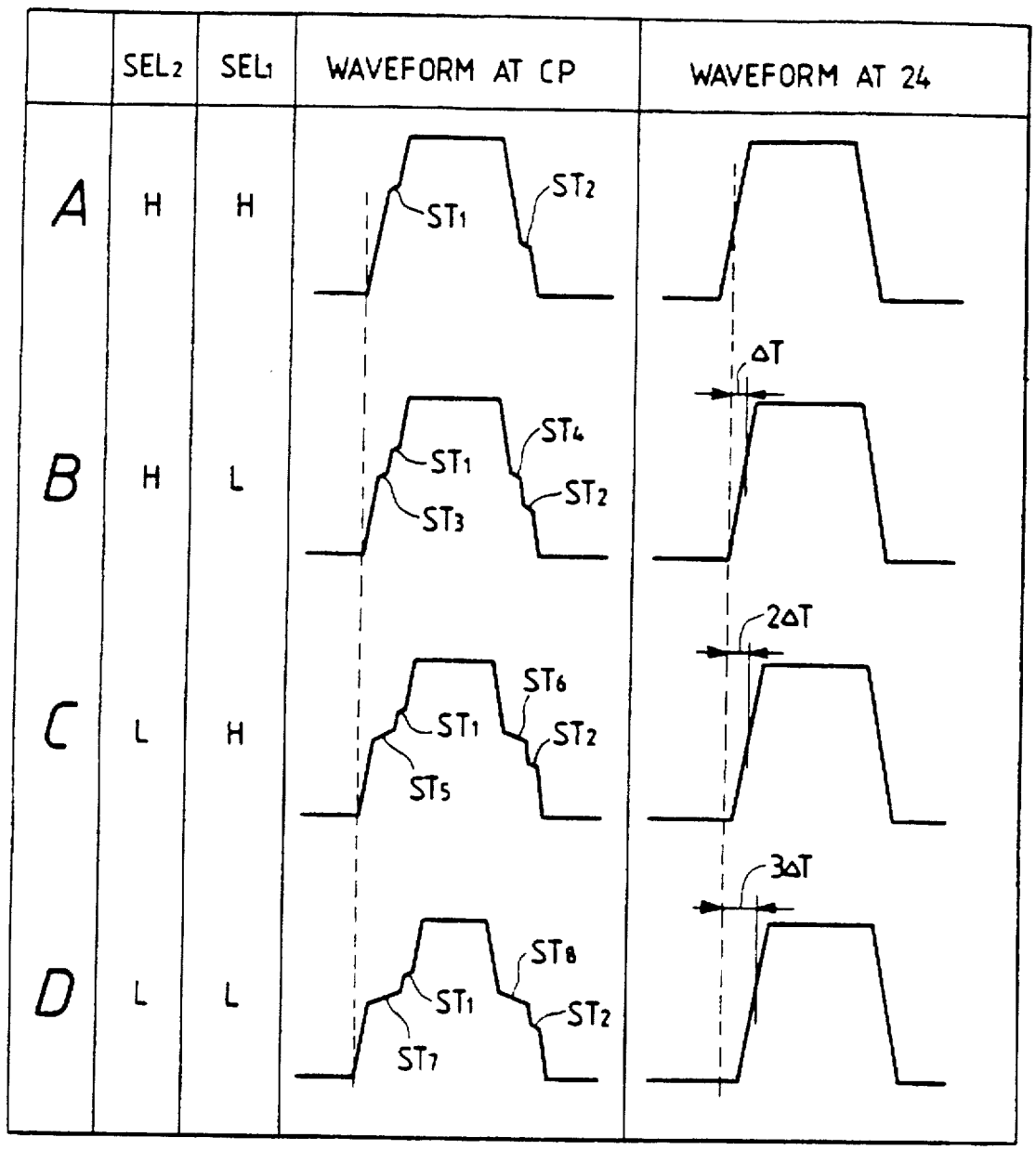
FIG. 3 TABLE I

VARIABLE DELAY CIRCUIT

This application is a continuation of application Ser. No. 08/527,128, filed Sep. 12, 1995, now abandoned which is a divisional of application Ser. No. 08/394,249, filed Feb. 24, 1995, U.S. Pat. No. 5,400,597 which is a divisional of application Ser. No. 08/253,216, filed Jun. 2, 1994, U.S. Pat. No. 5,400,260 which is a division of application Ser. No. 07/924,520 filed Aug. 4, 1992, now abandoned.

BACKGROUND OF THE INVENTION

The present invention relates to a fine variable delay circuit which is suitable for use as each of variable delay stages which are cascade-connected to form a variable delay circuit which is able to delay, for example, an input signal thereto for a desired period of time.

Generally speaking, CMOS logic circuits individually have inherent input-output delay times of their own depending on various conditions during manufacture. As compared with logic circuits formed by bipolar transistors, the CMOS circuits suffer their larger scattering delay time, and therefore, the use of such CMOS logic circuits for forming various circuits will lead to lack of a timing margin. A fine variable delay circuit is needed to correct variations in the input-output delay time of such a CMOS logic circuit.

FIG. 1A shows a conventional variable delay circuit formed by a plurality of cascade-connected variable delay stages to which the present invention is applicable. Variable delay stages 11, 12 and 13 are connected in series and the delay time of each stage is selectively variable by selecting one of two paths branched from its input under control of a multiplexer 14. In this example, the variable delay stage 11 has buffers 15 and 16 respectively provided in two paths, the variable delay stage 12 has one buffer 16 provided in only one of the two paths and the variable delay stage 13 has two series-connected buffers 16 provided in only one of the two paths. The propagation delay time Tpd of the buffer 16 is set to a value twice larger than the propagation delay time Tpd of the buffer 15. For instance, the buffer 15 may be formed by a series connection of two inverters, whereas the buffer 16 by a series connection of four inverters. By selective control of select signals $SEL_1$, $SEL_2$ and $SEL_3$ for the multiplexers 14 of the respective variable delay stages 11, 12 and 13, the path between an input terminal 17 and an output terminal 18 is changed for each stage, whereby delay times are 1, 2, ..., or 8 times as long as the propagation delay time Tpd of the buffer 15, respectively, are provided in this example.

In the case where a delay element 19 is provided in only one of the two paths in each of the variable delay stages 11, 12 and 13 as shown in FIG. 1B, the delays $d_1$, $d_2$ and $d_3$ of the delay elements 19 are A, 2A and 4A, respectively, where A is a minimum resolution desired to obtain. In the case of n variable delay stages being connected, the delay $d_n$ of the delay element 19 in the nth stage is $A2^{n-1}$.

With the prior art example depicted in FIG. 1A, it is difficult to raise or improve the resolution (i.e. to reduce the minimum variable step) partly because the delays of the buffers 15 and 16 are relatively large, for example, 200 to 500 pS and partly because the total propagation delay between the input and output terminals 17 and 18 consists in great part of a fixed delay. In other words, since the scattering of the delays of the buffers has an appreciable influence on the total propagation delay as a whole, it is difficult to raise the delay resolution within compensated scattering delay. In the case where the buffers 15 and 16 are fabricated as integrated circuits using CMOS, the scattering of their delays is particularly large, making it more difficult to increase the resolution than in the case where bipolar transistors are used to form the buffers 15 and 16.

The circuit arrangement shown in FIG. 1B also utilizes the propagation delay of each delay element 19, which scatters due to varying conditions during manufacture, variations in the power supply voltage and ambient temperature and the scatter of the line capacity as well. Letting the delay resolution, i.e. the minimum variable step be represented by A, it is possible, ideally, that the nth variable delay stage selects the delay 0 or $A2^{n-1}$ and that the delays ranging from 0 to $A2^{n-1}$ are selectively set every step A at will by the variable delay circuit formed by a total of M variable delay stages. Accordingly, the following equation holds:

$$A2^{n-1} = A(2^0 + 2^1 + \ldots + 2^{n-2}) + A2^0.$$

In practice, however, the delays of the respective delay stages scatter. Now, let the scattering or dispersion ratio of delay in each delay element be represented by $\alpha$. In the worst case, there are the possibilities that the sum of delays in variable delay stages preceding a certain stage becomes minimum due to scattering and that the delay in that certain stage becomes maximum due to scattering, and even in such a case, the required delay resolution A must be secured. In the actual design of the variable delay circuit it is necessary, therefore, to predetermine the delays $d_1$, $d_2$, ... of respective delay stages in anticipation of their scattering. That is, the delay $d_1$, which satisfies $(1+\alpha)d_1 = A$, is determined for the first delay stage 11; the delay $d_2$, which satisfies $(1+\alpha)d_2 = d_1(1-\alpha) + A$, and hence is equal to $2A/(1+\alpha)^2$, is determined for the second delay stage 12; and the delay $d_3$, which satisfies $(1+\alpha)d_3 = (d_1+d_2)(1-\alpha)$, and hence is equal to $2A/(1+\alpha)^3$, is determined for the third delay stage 13. In the case where n delay stages are connected in cascade, the delay of the nth stage is $D_n = 2^{n-1} \cdot A/(1+\alpha)^n$, taking the scatter of the delay into account.

Thus the influence of the delay scattering or dispersion ratio $\alpha$ increases as the last delay stage is approached and the delay becomes smaller than that $d_n = 2^{n-1} \cdot A$ in the ideal case, making it impossible to enlarge the range over which the delay of each delay stage is variable. In the case of using a CMOS gate array to form the delay element, the ratio $\alpha$ is usually around 0.6, and since this is an appreciably large value, the circuit which provides the desired delay would become inevitably large-scale, and hence is impractical.

SUMMARY OF THE INVENTION

It is therefore an object of the present invention to provide a fine variable delay circuit whose delay does not largely scatter and can be varied with a relatively small step.

According to an aspect of the present invention, an input signal is supplied to a buffer, which has an output impedance and outputs a logical level, and the output is provided to a schmidt trigger buffer. A CMOS transistor is connected at the input side to the connection point of the both buffers and connected at both ends to the power supply and the ground via first and second switching elements, respectively. The first and second switching elements are simultaneously controlled by a select signal.

BRIEF DESCRIPTION OF THE DRAWINGS

FIG. 3 is a table showing, by way of example, the relationships between the state of the select signal and waveforms appearing at a connection point CP and an output terminal 24.

FIG. 2 illustrates an embodiment according to an aspect of the present invention. While in the following embodiment of the fine variable delay circuit according to the present invention the source and drain of each FET are specified so as to facilitate a better understanding of their operation, the same operation as that described below will be obtained even if the source and the drain of the FET are exchanged. The input side of a buffer 61 is connected to a delay input terminal 23. The buffer 61 has an output impedance of a suitable magnitude and outputs logical levels. The output side of the buffer 61 is connected to the input side of a schmidt trigger buffer 62 which has threshold values for the rise and fall of the input signal. The output of the schmidt trigger buffer 62 is connected to the delay output terminal 24. The input side of a CMOS transistor $2C_1$ is connected to the connection point CP of the buffers 61 and 62. The CMOS transistor $2C_1$ has its both ends connected to the power supply terminal 20 and the grounding terminal 30 via a p-channel MOSFET $28_1$ and an n-channel MOSFET $32_1$ serving as switching elements, respectively. In the CMOS transistor $2C_1$ p-channel and n-channel MOSFETs $21_1$ and $22_1$ have their drains connected in series to each other and their gates are connected together and their connection point is connected as the input side to the connection point CP. The FET $21_1$ has its source connected via the switching element $28_1$ to the power supply terminal 20 and the FET $22_1$ has its source grounded via the switching element $32_1$.

Figure 1A:
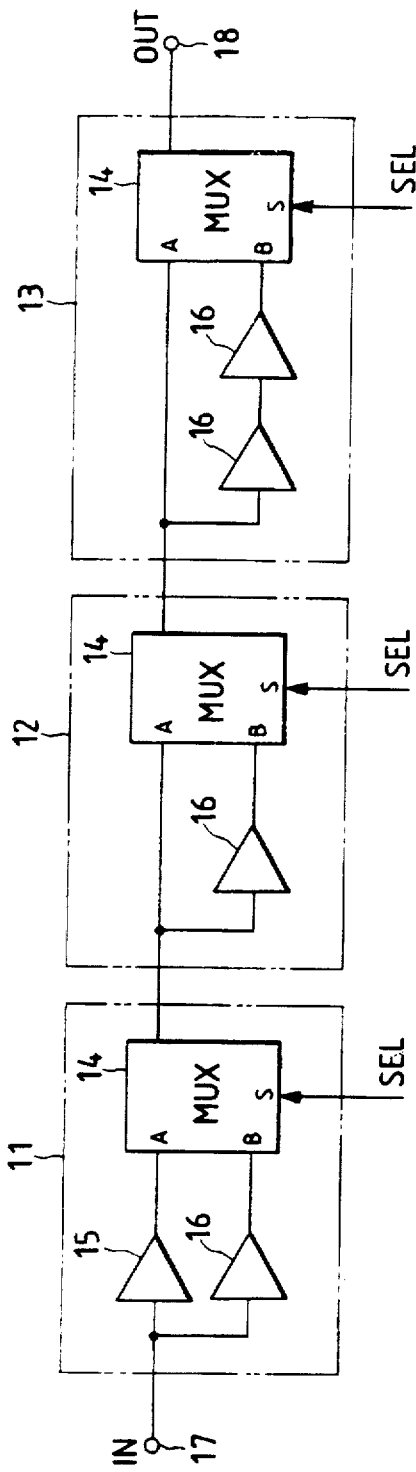
FIG. 1A is block diagram showing a conventional multistage variable delay circuit.

With a view to increasing the number of step widths of the variable delay, this embodiment further includes two parallel-connected CMOS transistors $2C_{2a}$ and $2C_{2b}$, which also have the same construction and characteristic as those of the CMOS transistor $2C_1$. Both ends of the two parallel-connected CMOS transistors $2C_{2a}$ and $2C_{2b}$ are connected to the power supply terminals 20 and 30 via a p-channel MOSFET $28_2$ and an n-channel MOSFET $32_2$ serving as switching elements, respectively. The CMOS transistors $2C_{2a}$ and $2C_{2b}$ have their gates connected to the connection point CP.

In order that the switching elements $28_1$ and $32_1$ may be simultaneously controlled to enter the same state by a select signal $SEL_1$ at a select signal input terminal $33_1$, the terminal $33_1$ is connected directly to the gate of the FET serving as the switching element $28_1$ and is connected via an inverter $34_1$ to the gate of the FET forming the switching element $32_1$. Likewise, the switching elements $28_2$ and $32_2$ are simultaneously controlled to enter the same state by a select signal $SEL_2$ at a select signal input terminal $33_2$.

With the above construction, when the select signals $SEL_1$ and $SEL_2$ at the terminals $33_1$ and $33_2$ are both high-level, the switching elements $28_1$, $32_1$, $28_2$ and $32_2$ are all OFF, and the CMOS transistor $2C_1$ side as viewed from the connection point CP is only a mere stray capacitance. Similarly, the CMOS transistor $2C_{2a}$ and $2C_{2b}$ sides as viewed from the connection point CP are only mere stray capacitances. By the Miller effect of these stray capacitances at the connection point CP, the input capacitance of the buffer 62 and the output impedance of the buffer 61 at the time of switching, small steps $ST_1$ and $ST_2$ appear in the rise and fall of the signal waveform at the connection point CP as shown in row A, left column in Table I of FIG. 3. This waveform is shaped by the buffer 62, and as a result, the output waveform at the delay output terminal 24 becomes such as shown in row A, right column in Table I.

In the case where the select signal $SEL_1$ is at the low level and the select signal $SEL_2$ at the high level, the switching elements $28_1$ and $32_1$ are both turned ON and the switching elements $28_2$ and $32_2$ OFF. On this account, the CMOS transistor $2C_1$ operates as an inverter which has its input at the connection point of the gates of the FETs $21_1$ and $22_1$ and its output at the connection point 64 of their drains. While this inverter is in operation, the load capacitance increases near its threshold value by virtue of the Miller effect. Hence, by the Miller effect of the load capacitance and the output impedance of the buffer 61 at the time of its switching, steps $ST_3$ and $ST_4$ larger than those $ST_1$ and $ST_2$ appear in the rise and fall of the waveform at the connection point CP as shown in Row B, left column in Table I of FIG. 3. In consequence, the waveform-shaped output obtainable at the output terminal 24 is delayed behind the corresponding output shown on Row A, right column by the time ΔT, as shown on row B, right column of Table I.

When the select signal $SEL_1$ is high-level and $SEL_2$ low-level, the switching elements $28_1$, and $32_1$ are both turned OFF but those $28_2$ and $32_2$ both ON. Hence, the parallel-connected CMOS transistors $2C_{2a}$ and $2C_{2b}$ both operate as inverters, and by the Miller effect, the load capacitance becomes twice larger than in the case where the CMOS transistor $2C_1$ operates as an inverter. As the result of this, steps $ST_5$ and $ST_6$ larger than $ST_3$ and $ST_4$ appear in the rise and fall of the waveform at the connection point CP as shown on Row C, left column of Table I, and the output waveform at the output terminal 24 is delayed behind the corresponding waveform on Row A by 2ΔT.

When the select signals $SEL_1$ and $SEL_2$ are both low-level, the switching elements $28_1$, $32_1$, $28_2$ and $32_2$ are all turned ON. Hence, the CMOS transistors $2C_1$, $2C_{2a}$ and $2C_{2b}$ all operate as inverters. As the result of this, larger steps $ST_7$ and $ST_8$ appear in the rise and fall of the waveform at the connection point CP as shown on Row D, left column in Table I of FIG. 3, and the output waveform at the output terminal 24 is delayed 3ΔT behind the corresponding waveform on Row A. By selecting the combination of the logical level states of the select signals $SEL_1$ and $SEL_2$ as described above, the input signal at the input terminal 23 can be delayed for any one of the four delay times before being provided to the output terminal 24.

By connecting more parallel-connected CMOS transistors, for example, four CMOS transistors, to the connection point CP and controlling them with another select signal, the number of delays can be increased. While in the above CMOS transistors of the same characteristic are used and the delay of a difference linearly in proportion to the number of CMOS transistors which operate as inverters is obtained, it is also possible to substitute, for example, the CMOS transistors $2C_{2a}$ and $2C_{2b}$ with one CMOS transistor of the type that the sizes of the FETs forming it vary in a multiple relationship, for example, one CMOS transistor of a size twice larger than that of the CMOS transistor $2C_1$.

As described above, according to this embodiment, one or more CMOS transistors are connected to the connection point of the buffer and the schmidt trigger buffer and are selectively controlled by the select signal to enter or leave the inverter operating state, by which the delay of the output signal is controlled through utilization of an increase in the load capacitance by the Miller effect bear the threshold value during the inverter operation. Hence, the difference ΔT between delays can be made small, for example, on the order of picoseconds to tens of picoseconds and the scatter of the difference ΔT can be reduced; therefore, high resolution can be obtained.

Figure 1B:
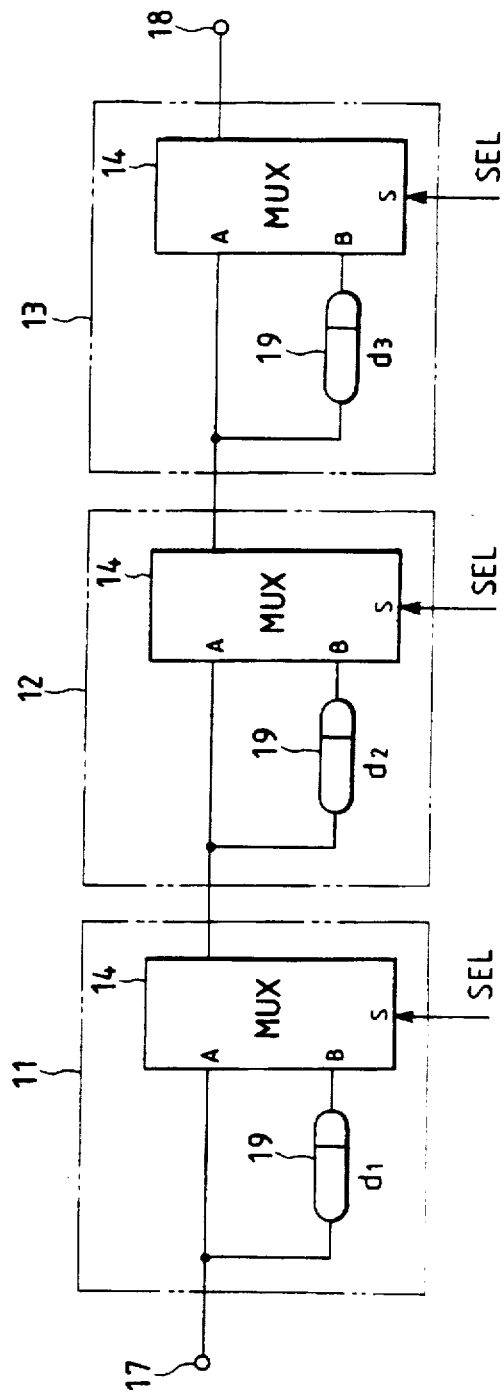
FIG. 1B is a block diagram showing another conventional multistage variable delay circuit.
Figure 2:
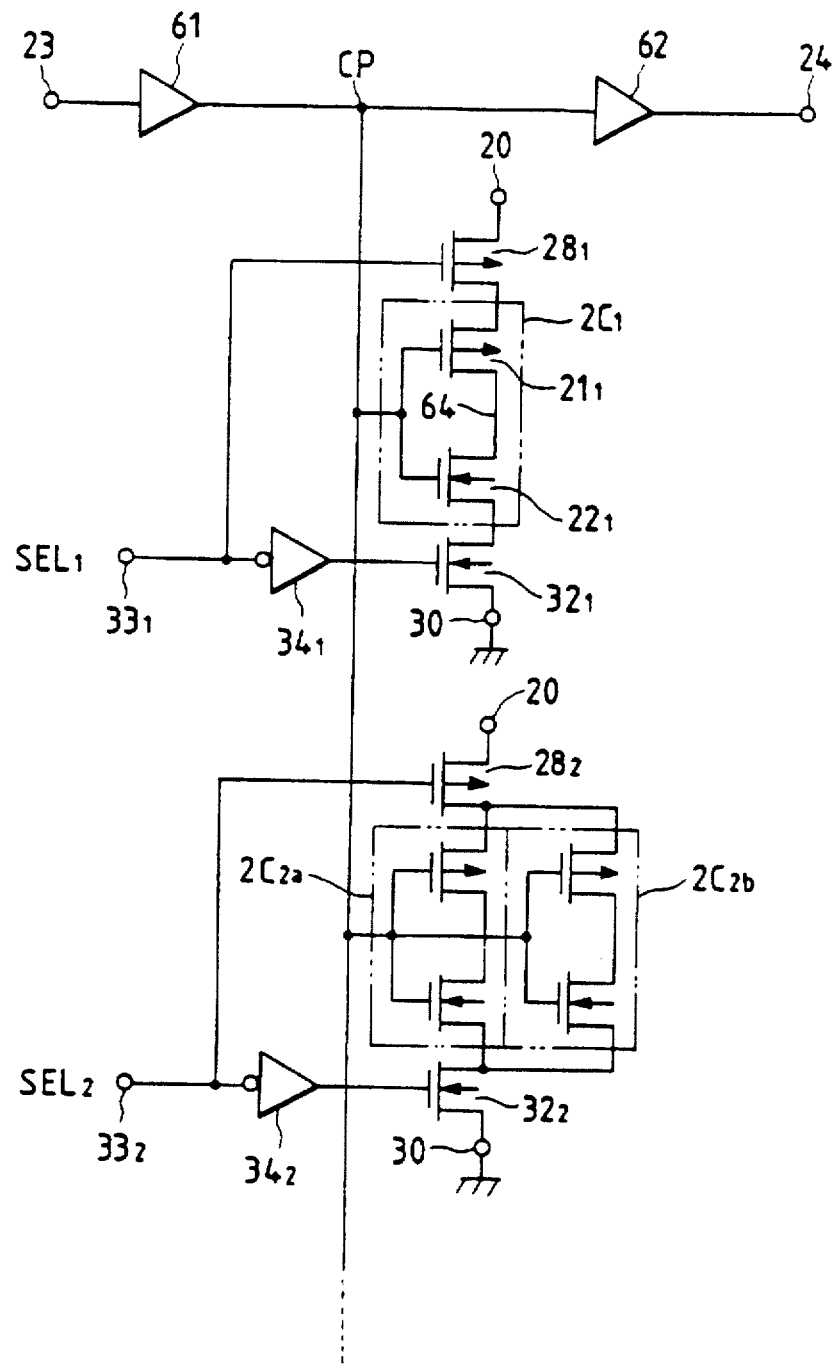
FIG. 2 is a circuit diagram illustrating an embodiment of the present invention.

The above-described embodiment, that is, the circuit shown in FIG. 2 may be used as an independent variable delay circuit or as individual delay stages in such a multi-stage connection as shown in FIGS. 1A and 1B. Moreover, FETs are used as transistors in the embodiments but bipolar transistors can be employed.

It will be apparent that many modifications and variations may be effected without departing from the scope of the novel concepts of the present invention.

What is claimed is:

1. A fine variable delay circuit comprising:
   a buffer having an input connected to a signal input terminal receiving an input signal and an output, said buffer having an output impedance and outputting a logical level from the output;
   a schmidt trigger buffer having an input connected to the output of said buffer and an output connected to a signal output terminal;
   a CMOS transistor comprising a gate and two electrodes, said gate being connected to a connection point between said buffer and said schmidt trigger buffer;
   a first switching element comprising one terminal connected to one of said electrodes of said CMOS transistor and another terminal connected to one terminal of a power supply;
   a second switching element comprising one terminal connected to another of said electrodes of said CMOS transistor and another terminal connected to another terminal of said power supply; and
   delay setting means responsive to a select signal for controlling said first switching element and said second switching element to set simultaneously each of said first switching element and said second switching element to one of an ON state and an OFF state,
   whereby in said OFF state said CMOS transistor functions as a stray capacitance thereby providing a fixed delay, and in said ON state said CMOS transistor functions as an inverter thereby providing a fine delay in addition to said fixed delay.

2. The fine variable delay circuit according to claim 1, further comprising:
   a second CMOS transistor having a gate and two electrodes, said gate being connected to the connection point between said buffer and said schmidt trigger buffer;
   a third switching element connected between said one electrode of said second CMOS transistor and said one terminal of said power supply;
   a fourth switching element connected between said other electrode of said CMOS transistor and said other terminal of said power supply; and
   second delay setting means responsive to an another select signal for controlling said third and fourth switching elements to simultaneously set them to one of an ON state and an OFF state, thereby setting a delay.

3. The fine variable delay circuit according to claim 1, wherein said first and second switching elements are two FETs of different conductivity types.

4. The fine variable delay circuit according to claim 2, wherein said third and fourth switching elements are two FETs of different conductivity types.

5. The fine variable delay circuit according to claim 1, wherein said delay setting means comprises an inverter having an input connected to a select signal input terminal and an output connected to one of said first and second switching elements, said select signal input terminal being connected to the other of said first and second switching elements.

6. The fine variable delay circuit according to claim 2, wherein said second delay setting means comprises and inverter having an input connected to an another select signal input terminal and an output connected to one of said third and fourth switching elements, said other select signal input terminal being connected to the other of said third and fourth switching elements.

7. The fine variable delay circuit according to claim 2, wherein said second CMOS transistor comprises two parallel-connected CMOS transistors having construction and characteristics of the first CMOS transistor.

* * * * *